United States Patent
Yasuda et al.

(10) Patent No.: US 6,720,731 B2
(45) Date of Patent: Apr. 13, 2004

(54) MERCURY DISCHARGE LAMP OF THE SHORT ARC TYPE

(75) Inventors: Yukio Yasuda, Himeji (JP); Yoshinoir Aiura, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/229,003

(22) Filed: Aug. 28, 2002

(65) Prior Publication Data

US 2003/0042853 A1 Mar. 6, 2003

(30) Foreign Application Priority Data

Aug. 30, 2001 (JP) ......................................... 2001-261246

(51) Int. Cl.[7] ................................................. H01J 17/20
(52) U.S. Cl. ........................ 313/571; 313/568; 313/570; 313/576; 313/637
(58) Field of Search ................................. 313/568, 570, 313/571, 576, 637

(56) References Cited

U.S. PATENT DOCUMENTS

| | | |
|---|---|---|
| 5,920,152 A | 7/1999 | Yasuda et al. |
| 5,977,709 A | 11/1999 | Yasuda et al. |
| 6,163,111 A | 12/2000 | Yasuda et al. |
| 2002/0017842 A1 * | 2/2002 | Narita .......................... 313/13 |

FOREIGN PATENT DOCUMENTS

JP          56-134465          10/1981

\* cited by examiner

*Primary Examiner*—Vip Patel
(74) *Attorney, Agent, or Firm*—Nixon Peabody LLP; David S. Safran

(57) ABSTRACT

A short arc mercury discharge lamp including an arc tube filled with at least mercury and a rare gas, a cathode and an anode positioned opposite to each other within the arc tube, the cathode having an tapered area which tapers in a direction towards the anode and a projection which protrudes from the tapered area in a direction towards the anode. The amount of mercury to be added in the arc tube is in a range of $0.2 \leq n \leq 52$, where n is the weight (mg/cm$^3$) of the mercury per unit of volume, and a pressure of the rare gas to be added in the arc tube is in a range of $0.1 \leq p \leq 800$, where p is the pressure (kPa) of the rare gas at an ambient temperature of 25° C.

14 Claims, 4 Drawing Sheets

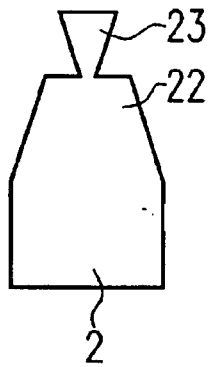 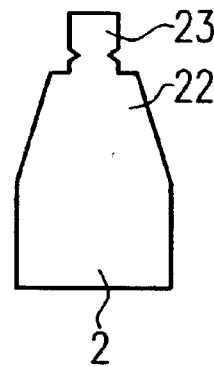 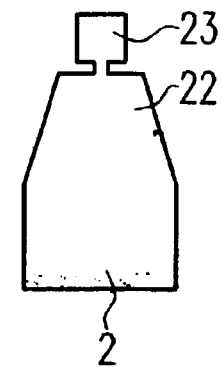 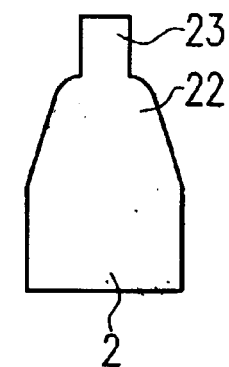
Fig.7(a)　Fig.7(b)　Fig.7(c)　Fig.7(d)
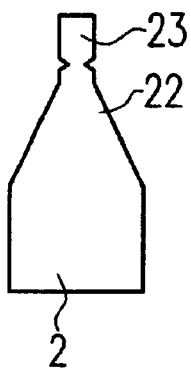 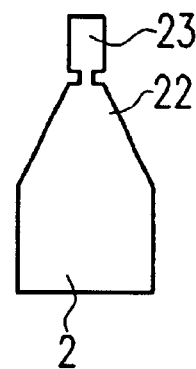 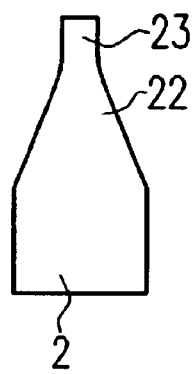
Fig.7(e)　Fig.7(f)　Fig.7(g)
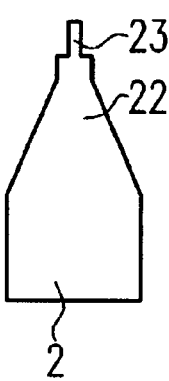 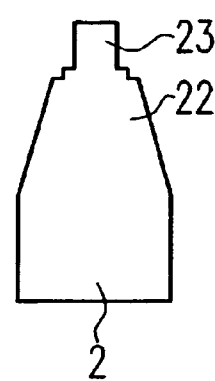 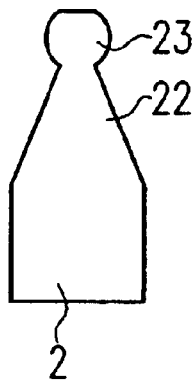
Fig.7(h)　Fig.7(i)　Fig.7(j)

MERCURY DISCHARGE LAMP OF THE SHORT ARC TYPE

BACKGROUND OF THE INVENTION

1. Field of the Invention

The invention relates to a mercury discharge lamp of the short arc type which is used for a light source of an exposure device for semiconductor exposure and for liquid crystal exposure.

2. Description of Related Art

Conventionally, in a mercury discharge lamp of the short arc type in an arc tube composed of a quartz bulb, there is a pair of electrodes, i.e., a cathode and an anode, whereby a distance between the electrodes is maintained at 2 mm to 13 mm, the arc tube being filled with the combination of mercury and a rare gas. The amount of mercury added to the arc tube is determined in accordance with the demand for light emitted by the lamp. When line spectra with a narrow band are required, as in semiconductor exposure, the amount of mercury to be added is reduced. When spectra having a large bandwidth are required, as in liquid crystal exposure, the amount of mercury to be added is increased.

The rare gas added to the arc tube is used mainly to improve the lamp starting property. But there are also cases in which it also has the purpose of increasing the heat insulation effect within the arc tube and the radiant efficiency. In one such mercury discharge lamp of the short arc type, however, there have been cases in which a phenomenon occurred such that devitrification or breakage of the arc tube took place within a short time immediately after the start of operation.

The reason for this phenomenon is described using FIG. 8. In a mercury discharge lamp of the short arc type, the pressure within the arc tube 1 before operation corresponds roughly to the pressure of the rare gas and is much lower than the pressure during operation. The principle reason for this is that before operation, the vapor pressure of the mercury is low. The reason for adding rare gas to the arc tube 1 is to reduce the discharge breakdown voltage between the cathode 2 and the anode 3 and to enable easier starting of the discharge.

In a state in which the pressure in the arc tube 1 is low directly after a discharge breakdown, the average free path length of the electrons released from the cathode 2 into the discharge space becomes greater. These electrons are in a state in which they can fly not only easily in the direction towards the anode 3, but also in the direction towards the arc tube 1.

As a result, there is an area (hereinafter called the "charge area R") in which the electrons which have a few collisions behind themselves and which have flown into the vicinity of the arc tube 1 ionize the rare gas in the vicinity of the electrons, and thus, in the vicinity of the inside of the arc tube 1. In this way, the electrons are attracted one after the other in the direction to this charge area R and move there. The arc due to the discharge which forms between the electrodes is maintained for a while after operation in a state away from the electrode axis X, i.e., in a state in which it has approached the surface of the arc tube 1 or is in contact with it. As a result, there have been cases in which devitrification of the arc tube 1 occurred and in which the arc tube 1 eventually broke.

SUMMARY OF THE INVENTION

The present invention is provided in order to eliminate the aforementioned disadvantages in the related art.

Accordingly, the object of the present invention is to provide a mercury discharge lamp of the short arc type in which a discharge which forms between the electrodes when the lamp starts is formed reliably along the electrode axis, and thus, the arc is reliably formed and maintained along the electrode axis in order to prevent devitrification and breakage of the arc tube.

A mercury discharge lamp of the short arc type includes an arc tube filled at least with a combination of mercury and a rare gas, and a pair of electrodes, i.e., a cathode and an anode, positioned oppositely therein. In accordance with the present invention, the cathode is provided with a tapering area such that in a direction towards the anode an inclined plane is formed.

The object of the invention is achieved in accordance with a first embodiment of the invention in that the amount of mercury added to the arc tube is $0.2 \leq n \leq 52$, where "n" is the weight per unit of volume (mg/cm$^3$) of mercury within the arc tube and $0.1 \leq p \leq 800$, where "p" is the pressure (kPa) of the rare gas to be added at an ambient temperature of 25° C., and a projection is formed on the cathode which borders the inclined plane of the tapering area.

The projection which borders the inclined surface of the tapering area of the cathode may be made cylindrical in geometric shape. Moreover, the tip area of the projection on the discharge side is provided with a flat surface, and is also formed bordering the inclined surface of the tapering area of the cathode and the angle between the flat surface and the side of the projection is at most 90°.

BRIEF DESCRIPTION OF THE DRAWINGS

FIG. 3(*b*) is a schematic which shows the potential state between the electrodes of a conventional lamp with a projection on the cathode tip using a model;

FIG. 4(*b*) shows graphic representations of the distributions of the electric fields between the electrodes shown in FIGS. 3(*a*) and 3(*b*);

FIGS. 7(*a*)–(*j*) each show a cross section of another version of the projection of the tip of the cathode in accordance with the invention.

DETAILED DESCRIPTION OF THE INVENTION

The mercury discharge lamp of the short arc type in accordance with the invention is used for emission of UV radiation which is optimum for semiconductor exposure or liquid crystal exposure. The amount of mercury added to the arc tube is in the range of $0.2 \leq n \leq 52$ where "n" is the weight per unit of volume (mg/cm$^3$) of mercury within the arc tube.

The reason for fixing this range is that an amount of mercury to be added which is less than 0.2 mg/cm$^3$, the amount of radiation necessary for exposure cannot be obtained. Moreover, an amount of mercury to be added that is greater than 52 mg/cm$^3$ produces unvaporized mercury during operation or the vapor pressure of the mercury within the arc tube becomes too high, and therefore, may result in the arc tube breaking.

In the mercury discharge lamp of the short arc type according to the invention, the pressure of the rare gas to be added to the arc tube is in the range of $0.1 \leq p \leq 800$, where "p" is the pressure (kPa) of the rare gas to be added at an ambient temperature of 25° C. The reason for fixing this range is due to the fact that the rare gas to be added to the arc tube is used mainly to improve the lamp starting property. Therefore, at less than 0.1 kPa, the discharge breakdown voltage becomes higher. On the other hand, the discharge breakdown voltage also increases at greater than 800 kPa, which may result in difficulty in obtaining a discharge.

Figure 1:
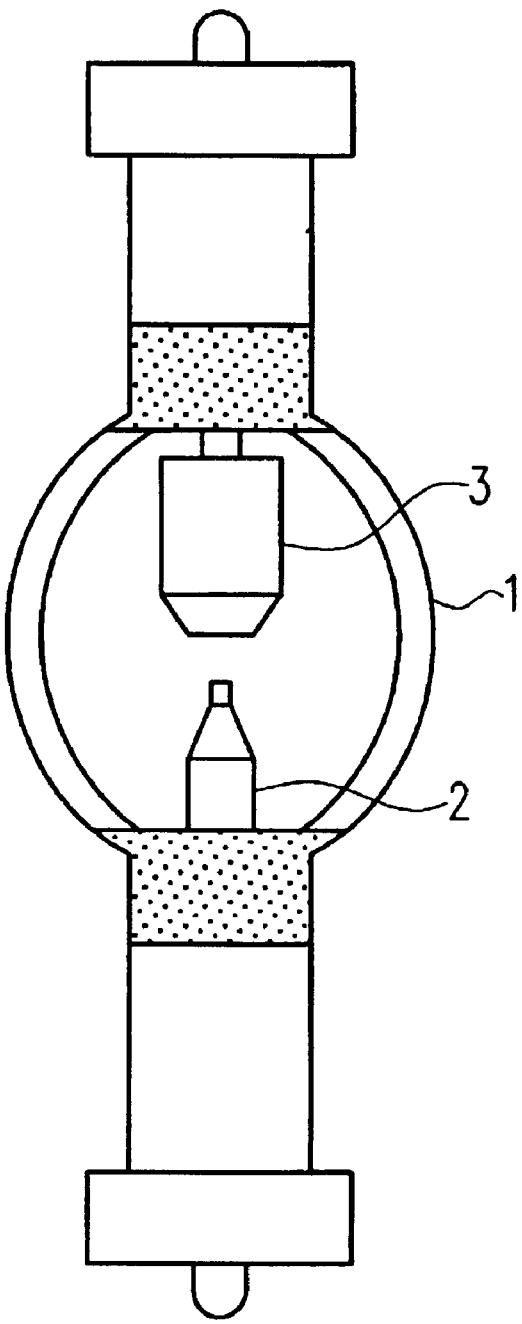
FIG. 1 shows a schematic of a mercury discharge lamp of the short arc type in accordance with the invention.
Figure 2:
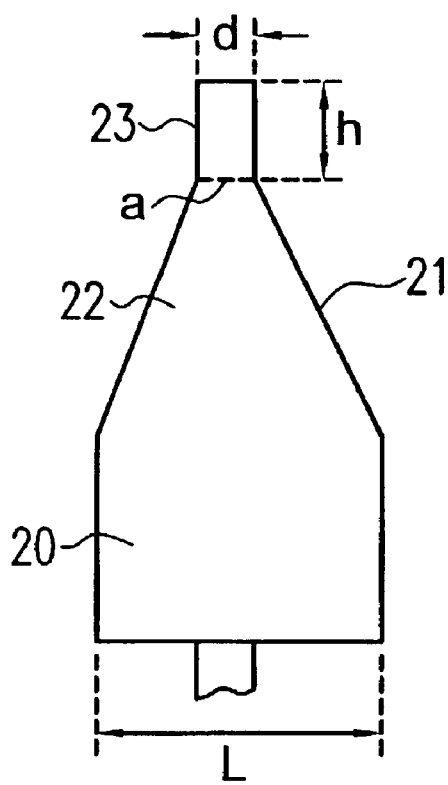
FIG. 2 shows an enlarged cross section of only the cathode of the lamp as shown in FIG. 1.

FIG. 1 is a schematic of a mercury discharge lamp of the short arc type in accordance with the invention while FIG. 2 is an enlarged cross-section in which only the cathode is shown. In the mercury discharge lamp of the short arc type in accordance with the invention, located in opposition of each other within a quartz glass arc tube 1 is a cathode 2 and an anode 3 composed preferably of tungsten. The cathode 2 is provided with a tapering area 22 in which an inclined plane 21 is formed in a direction towards the anode 3 such that the outside diameter of the cathode 2 gradually decreases in a direction towards the anode 3. Bordering the tapering area 22 is a projection 23 having a cylindrical shape. The projection 23 borders the inclined plane 21 of the tapering area 22. The body 20 of the cathode 2 preferably has a diameter "L" of 6 mm. The diameter "d" of the projection 23 is preferably 0.8 mm. The excess length "h" from the tip "a" of the tapering area 22 of the projection 23 is preferably 3 mm.

Figure 3A:
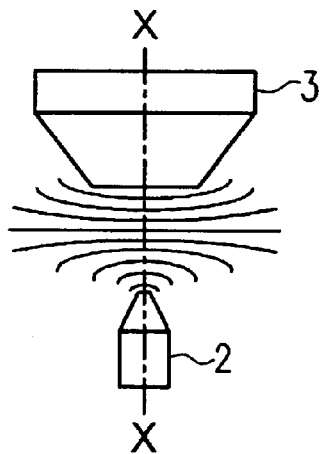
FIG. 3(*a*) is a schematic which shows the electric potential state between the electrodes of a conventional lamp without a projection on the cathode tip using a model.
Figure 3B:
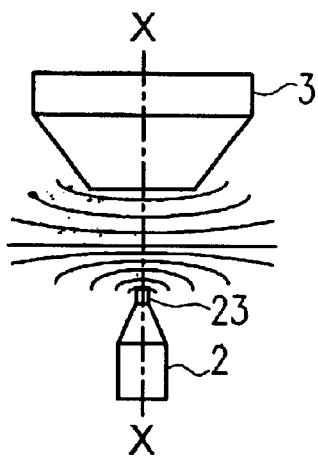

FIG. 3 describes the discharge phenomenon whereby FIG. 3(a) shows the potential state between the cathode 2 and the anode 3 (i.e., the electrodes) of a conventional lamp without a projection on the tip of the cathode 2 while FIG. 3(b) shows the potential state between the cathode 2 and the anode 3 of a lamp in accordance with the invention, i.e., a cathode 2 having a projection 23 on the tip end thereof. Between the respective cathode 2 and anode 3 are nine curves with the same electric potential. In FIGS. 3(a) and 3(b), "X" represents the electrode axis which connects the middle of the cathode 2 and the middle of the anode 3 to one another.

The nine curves with the same electric potential in FIGS. 3(a) and 3(b) which proceed from the tip of the cathode 2 each represent points having the same electric potential. As is apparent from FIGS. 3(a) and 3(b), the distance between the curves with the same electric potential in the tip area of the cathode 2 having a projection 23 in the lamp of the present invention is smaller. Furthermore, it becomes apparent that in the forward space of the projection 23 the electric potential has changed greatly.

Figure 4A:
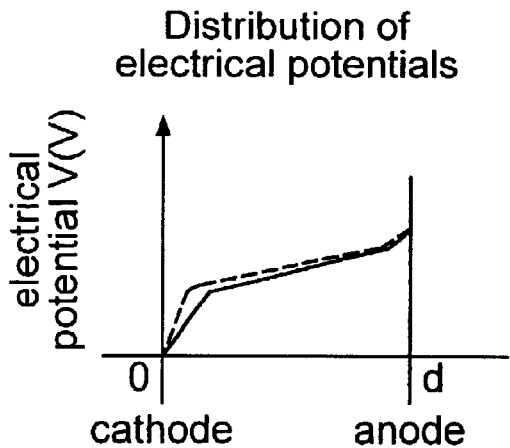
FIG. 4(*a*) shows graphic representations of the distributions of the electric potentials between the electrodes shown in FIGS. 3(*a*) and 3(*b*)
Figure 4B:
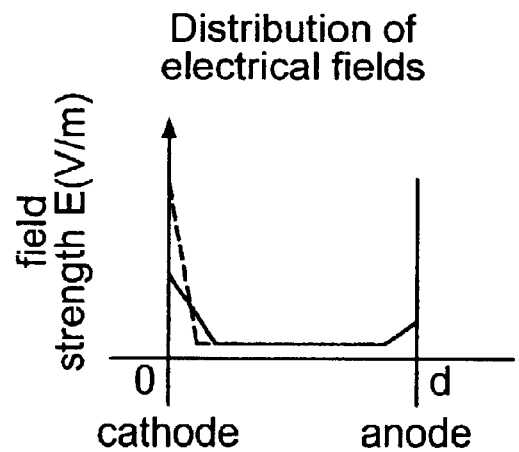

FIGS. 4(a) and 4(b) are graphic representations of the distributions of the electric potentials shown in FIGS. 3(a) and 3(b) between the cathode 2 and anode 3. FIG. 4(b) is a graphic representation of the distributions of the electric fields shown in FIGS. 3(a) and 3(b) between the cathode 2 and the anode 3. In FIG. 4(a), the solid line is a graphic representation of the distribution of the electric potential between the electrodes of a conventional lamp without a projection on the cathode tip while the broken line is a graphic representation of the distribution of the electric potential between the cathode 2 and anode 3 of the lamp in accordance with the invention having a projection 23 on the tip of the cathode 2.

As is apparent from FIG. 4(a), in the lamp having a cathode 2 with a projection 23 on the tip thereof, the electric potential in the forward space of the cathode 2 changes to a large extent. In FIG. 4(b), the solid line is a graphic representation of the distribution of the electric field between the electrodes of a conventional lamp without a projection on the cathode tip and the broken line is a graphic representation of the distribution of the electric field between the electrodes of the lamp in accordance with the invention with a projection on the cathode tip.

As is shown in FIG. 4(b), in the lamp having a cathode 2 with a projection 23 on the tip thereof, in the forward space of the projection 23 an extremely large electric field is formed. That is, by the arrangement of the projection 23 on the tip of the cathode 2 the electric potential in the forward space of the projection 23 can be changed to a large extent, and as a result thereof the field intensity of the space in front of the projection 23 can be increased. If in this way, the field intensity of the forward space of the projection 23 increases, in the case of a low pressure within the arc tube 1 the electrons released from the cathode 2 try to emerge from the electrode axis (X—X axis in FIGS. 3(a) and 3(b)) and fly in the direction towards the arc tube 1. Since the electrons are pulled back by this strong electric field and are forced into the area in front of the projection 23 of the cathode 2, the electrons fly in a straight line with the shortest distance in a direction towards the anode 3. Thus, the discharge which forms between cathode 2 and the anode 3 can be reliably maintained on the electrode axis. Consequently, the arc which is formed by the discharge is in a state in which it is reliably maintained along the electrode axis. Therefore, having the projection 23 on the cathode 2 serves to prevent the arc approaching the arc tube 1, devitrification of the arc tube 1, and breaking of the arc tube 1.

The optimum shape of the projection 23 is described below using FIG. 2. At a diameter "d" of the projection 23 of less than 0.4 mm, the field intensity of the forward space of the projection 23 increases. However, on the tip of the projection 23 a very high current density is achieved because at the tip of the projection 23 the arc is overly contracted. The tip of the projection 23 achieves an abnormally high temperature and is worn off in a short time. On the other hand, at a diameter of the projection 23 of greater than 3.0 mm, the degree of field intensity of the forward space of the projection 23 is decreased, and the passage of the discharge into the tip of the projection 23 becomes more difficult. It is therefore desirable for the diameter of the projection 23 to be in a range between 0.4 mm to 3.0 mm.

The excess length of the projection 23 is also described in FIG. 2. At an excess length "h" from the tip "a" of the tapering area 22 of the projection 23 of less than 0.3 mm, the passage of the discharge to the tip of the projection 23 is made more difficult due to the effect of the electric field which is formed in the tapering area 22 of the cathode 2. On the other hand, at an excess length "h" of at least 4.0 mm, the field intensity of the forward space of the projection 23 increases. However, when the distance between the tip of the projection 23 and the tapering area 22 becomes too long, a thermally interrupted state is formed. The tip of the projection 23 reaches a high temperature and is worn away within a short time. It is therefore desirable for the excess length of the projection 23 to be in a range between 0.3 mm to 4.0 mm.

Figure 5:
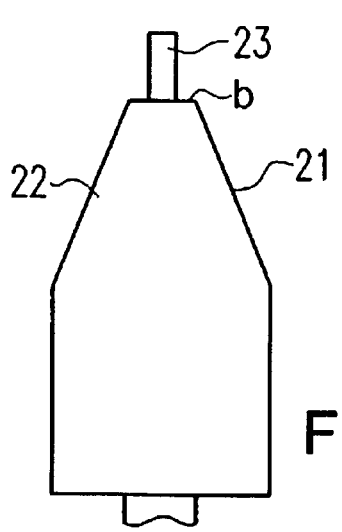
FIG. 5 shows a schematic of another embodiment of the cathode in accordance with the invention.

As shown in FIG. 5, the projection 23 can also be located in an area in which the tip of the tapering area 22 forms a flat plane "b" with the above-described numerical range of the diameter and the excess length such that the inclined plane 21 does not pass directly into the projection 23.

Figure 6:
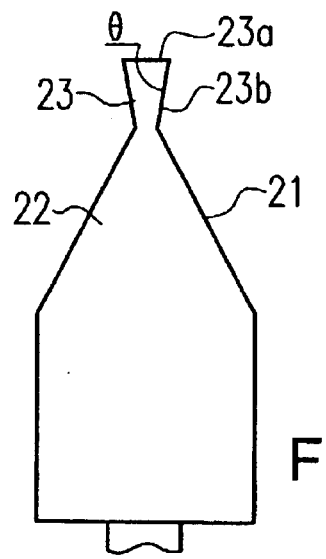
FIG. 6 shows a schematic of still another embodiment of the cathode in accordance with the invention.
Figure 8:
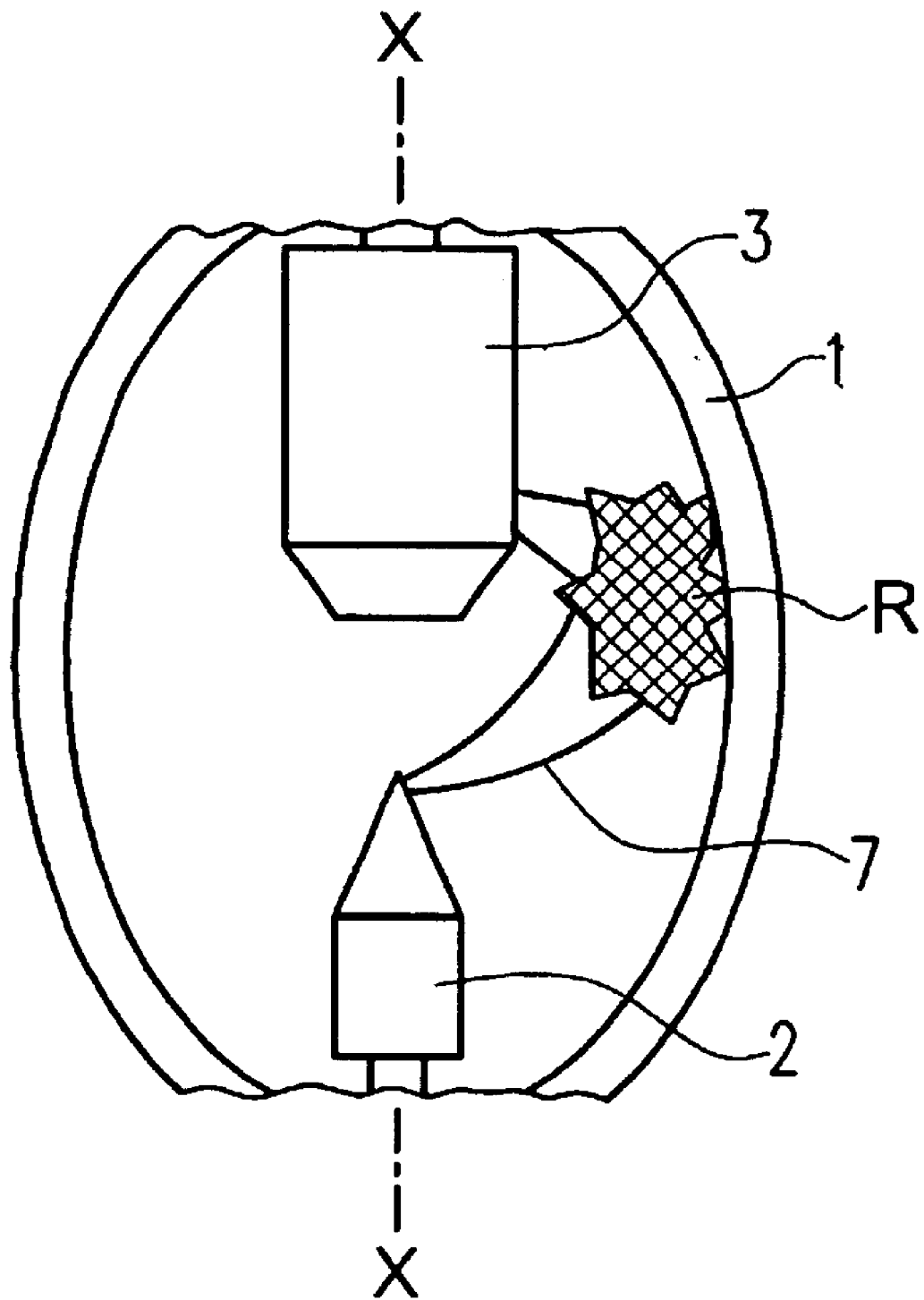
FIG. 8 shows a schematic of the discharge phenomenon.

FIG. 6 shows a cross-section of another embodiment of the projection 23 of the cathode 2. For the projection 23, the tip area on the discharge side forms a flat plane 23a. The projection 23 is formed bordering a bevel 21 of the tapering area 22, i.e., the bevel 21 and the projection 23 pass into one another. In the projection 23, the angle θ between the flat plane 23a of the tip area and the side 23b of the projection 23 is less than or equal to 90°. The angle θ is specifically 80° in this embodiment. Since the crossing angle between the flat plane 23a and the side 23b of the projection 23 is an acute angle, the electric potential of the forward space of the projection 23 of the cathode 2 and the electric field intensity can be increased even more. Therefore, the electrons released from the cathode 2 with an extremely high ratio can be concentrated only in the forward area of the cathode 2, and the discharge which forms between the cathode 2 and the anode 3 can be kept extremely stable on the electrode axis. As a result, the arc which is formed by the discharge is formed in a state in which it is maintained in an extremely stable manner along the electrode axis.

FIGS. 7(a)–7(j) are cross-sections of other embodiments of the projection 23 of the cathode 2. As is shown in FIGS. 7(a)–7(j), one projection 23 at a time is formed on the tip of the cathode 2. In FIG. 7(a), the tip of the tapering area 22 is formed as a flat plane from which the projection 23 protrudes. The angle between the tip surface on the discharge side of the projection 23 and its side is less than or equal to 90°. In FIGS. 7(b) and 7(c), the tip of the tapering area 22 is formed as a flat plane from which the projection 23 protrudes. On the side of the projection 23 which lies closer to the tapering area 22, a notch is formed. In FIG. 7(d), the tip of the tapering area 22 is formed as a curved area from which the projection 23 protrudes while in FIGS. 7(e) and 7(f) a notch or gap is situated between the tapering area 22 and the projection 23. In FIG. 7(g), the tapering area 22 and the projection 23 pass into one another without an inflection with a smooth curve shape. The border between the projection 23 and the tapering area 22 is not clear, but the action of the projection 23 is present. In FIGS. 7(h) and 7(i), the tip of the tapering area 22 has a diameter which decreases in a staggered manner with the projection 23 positioned on the tip thereof. In FIG. 7(j), on the tip of the tapering area 22 a drum-like projection 23 is positioned. While the tip of the projection 23 shown in FIGS. 7(a)–7(j) forms a flat plane, it is not limited to a flat plane, and may be formed in the direction towards the anode 3 in the form of a convex surface.

The projections 23 are each formed in a shape which borders the tapering area 22. By forming the projection 23 on the tip of the cathode 2 in this way the electric potential of the forward space of the projection 23 can be changed to a large degree and the field intensity of the forward space of the projection 23 can be increased. The arc which is formed by the discharge is thus in a state in which it is reliably maintained along the electrode axis. Such a design serves to prevent the arc approaching the arc tube 1, devitrification of the arc tube 1, and breaking of the arc tube 1.

In the mercury discharge lamp of the short arc type in accordance with the invention, because the cathode 2 bordering the tapering area 22 has a projection 23, the electric potential of the forward area of the projection 23 can be changed, the field intensity in front of the projection 23 can be increased and the discharge which is formed between the cathode 2 and the anode 3 can be maintained on the electrode axis. The arc which is formed by the discharge is therefore formed in a state in which it is maintained along the electrode axis. Such a design serves to prevent the arc approaching the arc tube 1, devitrification of the arc tube 1, and breaking of the arc tube 1. In particular, if the projection 23 is cylindrical-shaped to border the inclined plane of the tapering area 22 of the cathode 2, the electric potential of the forward space of the projection 23 can be reliably changed to a large degree and the field intensity in front of the projection 23 can be reliably increased. Thus, the arc can be reliably formed along the electrode axis by the discharge.

If the projection 23 of the tip area on the discharge side a flat plane forms and moreover is formed bordering the inclined plane of the tapering area 22 of the cathode 2 and the angle between the flat plane and the side flank of the projection 23 is less than or equal to 90°, the electric potential of the forward space of the projection 23 can be changed to an extremely large degree, the field intensity in front of the projection 23 can be made extremely large and the arc can be formed to be extremely stable along the electrode axis by the discharge.

What is claimed is:

1. A short arc mercury discharge lamp comprising:
   an arc tube filled with at least mercury and a rare gas;
   a cathode and an anode positioned opposite to each other within the arc tube, the cathode having a tapered area and a projection, the tapered area tapering in a direction towards the anode and the projection axially projecting from the tapered area in a direction towards the anode,
   wherein the amount of mercury added in the arc tube is in a range of $0.2 \leq n \leq 52$, where n is the weight (mg/cm$^3$) of the mercury per unit of volume and a pressure of the rare gas added in the arc tube is in a range of $0.1 \leq p \leq 800$, where p is the pressure (kPa) of the rare gas at an ambient temperature of 25° C.

2. The short arc mercury discharge lamp as claimed in claim 1, wherein the projection has an essentially cylindrical shape.

3. The short arc mercury discharge lamp as claimed in claim 1, wherein the tapered area of the cathode has essentially a truncated cone shape with an essentially circular tip surface such that the projection projects from the essentially circular tip surface of the truncated cone.

4. The short arc mercury discharge lamp as claimed in claim 3, wherein the diameter of the essentially circular tip surface corresponds to the diameter of the projection at least in an area in which the projection and the tapered area of the cathode border one another.

5. The short arc mercury discharge lamp as claimed in claim 4, wherein the diameter of the projection over its entire length corresponds to the diameter of the essentially circular tip surface.

6. The short arc mercury discharge lamp as claimed in claim 4, wherein the diameter of the projection decreases in a staggered manner between an area of the projection which borders the tapered area of the cathode and a distal end of the projection.

7. The short arc mercury discharge lamp as claimed in claim 4, wherein the diameter of the projection gradually increases between an area of the projection which borders the tapered area of the cathode and a distal end of the projection.

8. The short arc mercury discharge lamp as claimed in claim 4, wherein a gap is provided between the projection and the tapered area of the cathode.

9. The short arc mercury discharge lamp as claimed in claim 3, wherein the diameter of the projection at least in an area in which the projection and the tapered area of the cathode border one another is smaller than the diameter of the essentially circular tip surface.

10. The short arc mercury discharge lamp as claimed in claim 9, wherein the diameter of the projection gradually increases between an area of the projection which borders the tapered area and a distal end of the projection.

11. The short arc mercury discharge lamp as claimed in claim 9, wherein a gap is provided between the projection and the tapered area of the cathode.

12. The short arc mercury discharge lamp as claimed in claim 4, wherein the diameter of the projection gradually increases between an area of the projection which borders the tapered area to a midpoint of the projection and then gradually decreases from the midpoint of the projection to a distal end of the projection.

13. The short arc mercury discharge lamp as claimed in claim 9, wherein the diameter of the projection gradually increases between an area of the projection which borders the tapered area to a midpoint of the projection and then gradually decreases from the midpoint of the projection to a distal end of the projection.

14. The short arc mercury discharge lamp as claimed in claim 1, wherein the projection has an end face which points towards the anode such that an angle between the end face and a side flank of the projection is less than or equal to 90°.

* * * * *

UNITED STATES PATENT AND TRADEMARK OFFICE
CERTIFICATE OF CORRECTION

PATENT NO. : 6,720,731 B2  Page 1 of 1
APPLICATION NO. : 10/229003
DATED : April 13, 2004
INVENTOR(S) : Yukio Yasuda et al.

It is certified that error appears in the above-identified patent and that said Letters Patent is hereby corrected as shown below:

Title Pg. Item [75] "Inventors", delete "Yoshinoir" and add -- Yoshinori --

Signed and Sealed this

Twenty-second Day of May, 2007

JON W. DUDAS
*Director of the United States Patent and Trademark Office*